United States Patent [19]

Nakao et al.

[11] Patent Number: 5,670,800
[45] Date of Patent: Sep. 23, 1997

[54] SEMICONDUCTOR DEVICE AND METHOD FOR FABRICATING THE SAME

[75] Inventors: Hiroshi Nakao; Toshihiko Mori, both of Kawasaki, Japan

[73] Assignee: Fujitsu Limited, Kawasaki, Japan

[21] Appl. No.: 490,211

[22] Filed: Jun. 14, 1995

[30] Foreign Application Priority Data

Aug. 25, 1994 [JP] Japan ................... 6-200726

[51] Int. Cl.$^6$ ............... H01L 31/0328; H01L 31/0336; H01L 31/072; H01L 31/109
[52] U.S. Cl. ................................. 257/190; 257/189
[58] Field of Search ................... 257/190, 189, 257/96, 103, 30

[56] References Cited

U.S. PATENT DOCUMENTS 5,187,116  2/1993  Kitagawa et al. .............. 437/105
5,431,751  7/1995  Okochi et al. .................. 148/437

FOREIGN PATENT DOCUMENTS 3-064031 A  3/1991  Japan .

OTHER PUBLICATIONS

N. Tabatabaie et al., "Negative differential resistance in AlAs/NiAl/AlAs Heterostructures: Evidence for size quantization in metals", Appl. Phys. Lett. 53 (1988) pp. 2528–2530.

J.W. Matthews et al., "Defects in epitaxial multilayers", J. Crystal Growth 27 (1974) pp. 118–125.

Electronics Letters, 22nd Jul. 1993. vol. 29 No. 15, pp. 1346–1347.

Jpn. J. Appl. Phys. vol. 32 (1993) pp. 1919–1922.

*Primary Examiner*—Stephen Meier
*Attorney, Agent, or Firm*—Armstrong, Westerman, Hattori, McLeland & Naughton

[57] ABSTRACT

A semiconductor device includes a layer 16 of intermetallic compound layer 16 formed on a base substrate 10. The intermetallic compound is a ternary intermetallic compound 16 mixing a set amount of In with one of CoGa, NiGa, FeGa, CoAl, NiAl and FeAl . Twice of a lattice constant of the ternary intermetallic compound 16 is substantially equal to a lattice constant of a compound semiconductor forming the base substrate 10. Accordingly, the layer 16 of the intermetallic compound free from misfit dislocations can be formed on the semiconductor substrate or the semiconductor layer, and semiconductor elements can be formed on the wiring layer of the intermetallic compound layer 16.

27 Claims, 9 Drawing Sheets

| SECTIONAL VIEW ALONG Ax DIRECTION | SECTIONAL VIEW ALONG Ay DIRECTION |

1

SEMICONDUCTOR DEVICE AND METHOD FOR FABRICATING THE SAME

BACKGROUND OF THE INVENTION

The present invention relates to a metal wiring for use in a semiconductor device formed of a compound semiconductor, particularly to a semiconductor device including semiconductor elements formed on a metal wiring, and a method for fabricating the same.

To interconnecting integrated semiconductor elements, conventionally electrodes are led out of the elements, and a metal wiring is formed on the electrodes. For example, in the semiconductor device as shown in FIG. 9A, wirings must be formed on the top of an element 72 formed above a substrate 70, and the underside of the element 72. To this end, as shown in FIG. 9A, a heavily doped semiconductor layer 74 of low resistance is epitaxially grown on a buffer layer 71 on the substrate 70, and the element 72 is formed on the semiconductor layer 74. A metal wiring 76 is led out, as a lower electrode of the element 72, from a part of the semiconductor layer 74 where the element 72 is not formed. A metal wiring 78 is formed on the top of the element 72. Thus the wirings are lead out from the top and the underside of the element 72.

A reason for the formation of the wiring on the top of the element 72 following the formation of the element 72 is as follows. That is, to bury the metal wiring 76 and form the element 72 on the metal wiring 76 as shown in FIG. 9B, the metal wiring 76 is epitaxially grown on the buffer layer 71 on the substrate 70, and the element 72 is formed on the top thereof. The semiconductor layer formed on the metal wiring 76 has poor crystallization which is insufficient to form the element 72.

To form the wiring, a semiconductor layer of low resistance may be buried in place of the metal wiring 76, but the semiconductor layer has much higher resistivity than metal, which might be a cause for signal transmission delay.

If it is possible to form the metal wiring 78 on the underside of the element 72, an area for one element could be saved and higher heat radiation could be expected because metal has higher heat conducting efficiency than semiconductor and insulation films.

In such circumstances, vigorous studies of epitaxially growing a metal layer on a semiconductor substrate and a semiconductor layer on the metal layer are made. To be specific, as a metal which is able to be epitaxially grow on a semiconductor substrate, an intermetallic compound, such as NiAl, CoGa or others, twice of whose lattice constant is a lattice constant of the compound semiconductor is studied, and the metal layer is actually grown by molecular beam epitaxy (MBE) or other techniques.

According to a study by N. Tabatabaie, et al. (N. Tabatabaie, et al., "Applied Physics Letters, vol. 53 (1988) (USA), pp. 2528–2530), they have succeeded in fabrication of a resonant-tunnel diode of AlAs/NiAl/AlAs heterostructure.

To use such intermetallic compound for the wiring, the film must have some thickness to suppress signal transmission delay and voltage drop by the wiring.

But the conventional method for fabricating a semiconductor device of an intermetallic compound has a problem that, when the intermetallic compound is grown thick, misfit dislocations occur, and the film quality is degraded, because a difference between twice a lattice constant of the intermetallic compound and a lattice constant of the semiconductor compound is some percentage.

A semiconductor layer of good quality cannot be epitaxially grown on the top of the thick intermetallic compound layer. Accordingly, the buried metal wiring cannot be formed as shown in FIG. 9B. This is a problem.

SUMMARY OF THE INVENTION

An object of the present invention is to provide a semiconductor device and a method for fabricating the same which decrease lattice misfit between an intermetallic compound and a semiconductor to form an layer of the intermetallic compound free from misfit dislocations on a substrate or a layer of the semiconductor substrate, and can form a semiconductor element on a wiring of the intermetallic compound.

The above-described object is achieved by a semiconductor device comprising a base substrate and a intermetallic compound layer made of a intermetallic compound formed on the base substrate, the intermetallic compound being a ternary intermetallic compound mixing a set amount of In with one of CoGa, NiGa, FeGa, CoAl, NiAl and FeAl, twice of a lattice constant of the ternary intermetallic compound being substantially equal to a lattice constant of compound semiconductor forming the base substrate.

In the above-described semiconductor device, it is preferable that the semiconductor device further comprises a compound semiconductor layer made of a compound semiconductor formed on the intermetallic compound layer, the compound semiconductor layer being epitaxially grown on the intermetallic compound layer.

In the above-described semiconductor device, it is preferable that a film thickness of the intermetallic compound layer is above about 40 nm.

In the above-described semiconductor device, it is preferable that a film thickness of the intermetallic compound layer is above about 100 nm.

In the above-described semiconductor device, it is preferable that a lattice misfit between twice of the lattice constant of the intermetallic compound layer and the lattice constant of the compound semiconductor forming the base substrate is below about 0.2%.

In the above-described semiconductor device, it is preferable that a lattice misfit between twice of the lattice constant of the intermetallic compound layer and the lattice constant of the compound semiconductor forming the base substrate is below about 0.1%.

In the above-described semiconductor device, it is preferable that the base substrate is an InP substrate.

In the above-described semiconductor device, it is preferable that the base substrate is an $In_{0.53}Ga_{0.47}As$ layer or an $In_{0.52}Al_{0.48}As$ layer.

In the above-described semiconductor device, it is preferable that the intermetallic compound is $CoIn_xAl_{1-x}$, and x is within a range of 0.37±0.04.

In the above-described semiconductor device, it is preferable that the intermetallic compound is $CoIn_xGa_{1-x}$, and x is within a range of 0.28±0.04.

In the above-described semiconductor device, it is preferable that the intermetallic compound is $NiIn_xAl_{1-x}$, and x is within a range of 0.24±0.04.

In the above-described semiconductor device, it is preferable that the intermetallic compound is $NiIn_xGa_{1-x}$, and x is 0.23±0.04.

In the above-described semiconductor device, it is preferable that the intermetallic compound is $FeIn_xAl_{1-x}$, and x is 0.12±0.04.

In the above-described semiconductor device, it is preferable that the intermetallic compound is $FeIn_xGa_{1-x}$, and x is within a range of 0.12±0.04.

In the above-described semiconductor device, it is preferable that the base substrate is an InAs substrate.

In the above-described semiconductor device, it is preferable that the intermetallic compound is $CoIn_xAl_{1-x}$, and x is within a range of 0.84±0.04.

In the above-described semiconductor device, it is preferable that the intermetallic compound is $CoIn_xGa_{1-x}$, and x is within a range of 0.75±0.04.

In the above-described semiconductor device, it is preferable that the intermetallic compound is $NiIn_xAl_{1-x}$, and x is within a range of 0.71±0.04.

In the above-described semiconductor device, it is preferable that the intermetallic compound is $NiIn_xGa_{1-x}$, and x is within a range of 0.70±0.04.

In the above-described semiconductor device, it is preferable that the intermetallic compound is $FeIn_xAl_{1-x}$, and x is within a range of 0.59±0.04.

In the above-described semiconductor device, it is preferable that the intermetallic compound is $FeIn_xGa_{1-x}$, and x is within a range of 0.58±0.04.

The above-described object is achieved by a method for fabricating a semiconductor device in which a layer of a intermetallic compound of Group III metals and a different metal is epitaxially Grown on a base substrate, a temperature of the base substrate being below 300° C., and the intermetallic compound layer being epitaxially grown by alternately feeding the Group III metals, and the different metal.

In the above-described method for fabricating a semiconductor device, it is preferable that the Group III metals are Al and In, or Ga and In, and the different metal is Co, Ni or Fe.

According to the present invention, a ternary intermetallic compound is prepared by mixing a set amount of In to either of intermetallic compounds, CoGa, NiGa, FeGa, CuAl, NiAl and FeAl, whereby twice of a lattice constant of the intermetallic compound is substantially equal to a lattice constant of a compound semiconductor forming a base substrate. A intermetallic compound layer free from misfit dislocations can be epitaxially grown.

A semiconductor layer can be further epitaxially grown on the top of the intermetallic compound layer grown on the base substrate. The intermetallic compound can be used as a buried wiring layer.

A intermetallic compound layer is epitaxially grown in an above 40 nm thickness on the base substrate. The intermetallic compound layer can be used as a wiring layer.

A intermetallic compound layer free from misfit dislocations is epitaxially grown in an above 100 nm thickness on the base substrate. The intermetallic compound layer can be used as a wiring layer of low resistance.

A lattice misfit between twice of a lattice constant of the intermetallic compound and a lattice constant of the compound semiconductor forming the base substrate is set to be below about 0.2%. A intermetallic compound layer free from misfit dislocations can be grown in an above 40 nm thickness.

A lattice misfit between twice of a lattice constant of the intermetallic compound and a lattice constant of the compound semiconductor forming the base substrate is set to be below about 0.1%. A intermetallic compound layer free from misfit dislocations can be grown in an above 100 nm thickness.

The intermetallic compound layer is applicable to semiconductor device using an InP substrate as the base substrate.

The intermetallic compound layer is applicable to a semiconductor device including as the base substrate an $In_{0.53}Ga_{0.47}As$ layer or an $In_{0.52}Al_{0.48}As$ layer.

$CoIn_xAl_{1-x}$ is used as the intermetallic compound, and x is 0.37±0.04, and a intermetallic compound layer free from misfit dislocations can be epitaxially grown on an InP substrate.

$CoIn_xGa_{1-x}$ is used as the intermetallic compound, and x is 0.28±0.04. The intermetallic compound free from misfit dislocations can be epitaxially grown on the InP substrate.

$NiIn_xAl_{1-x}$ is used as the intermetallic compound, and x is 0.23±0.04, and a intermetallic compound free from misfit dislocations can be epitaxially grown on the InP substrate.

$FeIn_xAl_{1-x}$ is used as the intermetallic compound, and x is 0.12±0.04, and the intermetallic compound free from misfit dislocations can be epitaxially grown on the InP substrate.

The intermetallic compound is applicable to a semiconductor device using an InAs substrate as the base substrate.

$CoIn_xAl_{1-x}$ is used as the intermetallic compound, and x is 0.84±0.04. The intermetallic compound free from misfit dislocations can be epitaxially grown on an InAs substrate.

$CoIn_xGa_{1-x}$ is used as the intermetallic compound, and x is 0.75±0.04. The intermetallic compound free from misfit dislocations can be epitaxially grown on the InAs substrate.

$NiIn_xAl_{1-x}$ is used as the intermetallic compound, and x is 0.71±0.04. The intermetallic compound free from misfit dislocations can be epitaxially grown on the InAs substrate.

$FeIn_xAl_{1-x}$ is used as the intermetallic compound, and x is 0.59±0.04. The intermetallic compound free from misfit dislocations can be epitaxially grown on the InAs substrate.

$FeIn_xAl_{1-x}$ is used as the intermetallic compound, and x is 0.58±0.04. The intermetallic compound free from misfit dislocations can be epitaxially grown on the InAs substrate.

The intermetallic compound layer is epitaxially grown by alternately feeding Group III metals, and a metal of another Group at a below 300° C. base substrate temperature. The intermetallic compound layer having good crystallization can be two-dimensionally grown on a base substrate.

In the above-described method for fabricating the semiconductor device, the Group III metals can be Al and In, or Ga and In, and another metal can be Co, Ni or Fe.

DETAILED DESCRIPTION OF THE INVENTION

The present invention is characterized in that a compound semiconductor substrate and an intermetallic compound are brought into lattice matching with each other so that the latter can epitaxially grown on the former, and a buried metal wiring is formed.

First, the conditions for using an intermetallic compound as a wiring will be explained.

A case that a voltage drop is suppressed to be below 100 mV when a 1 μA current is flowed through a 1 mm-length wire of a 0.1 μm width will be discussed. A material of the wiring is, e.g NiAl. The resistivity of NiAl is 10–40 μΩ.cm. The wiring must be deposited in a film thickness of above 10–40 nm.

On the other hand, based on the theory of Matthews (J. W. Matthews) et al., a critical film thickness for occurrence of a misfit dislocation is expressed by $$hc = \frac{b}{4\pi(1+\gamma)f} \left\{ \ln\left(\frac{b}{hc}\right) + 1 \right\}$$

(Reference: Journal of Crystal Growth, vol 27 (1984), p.118). In the formula, hc represents a critical film thickness; b, a Burgers vector; γ, a Poisson ratio; and f, a lattice misfit. When a Burgers vector and a Poisson ratio are determined, a critical film thickness can be approximated.

Figure 1:
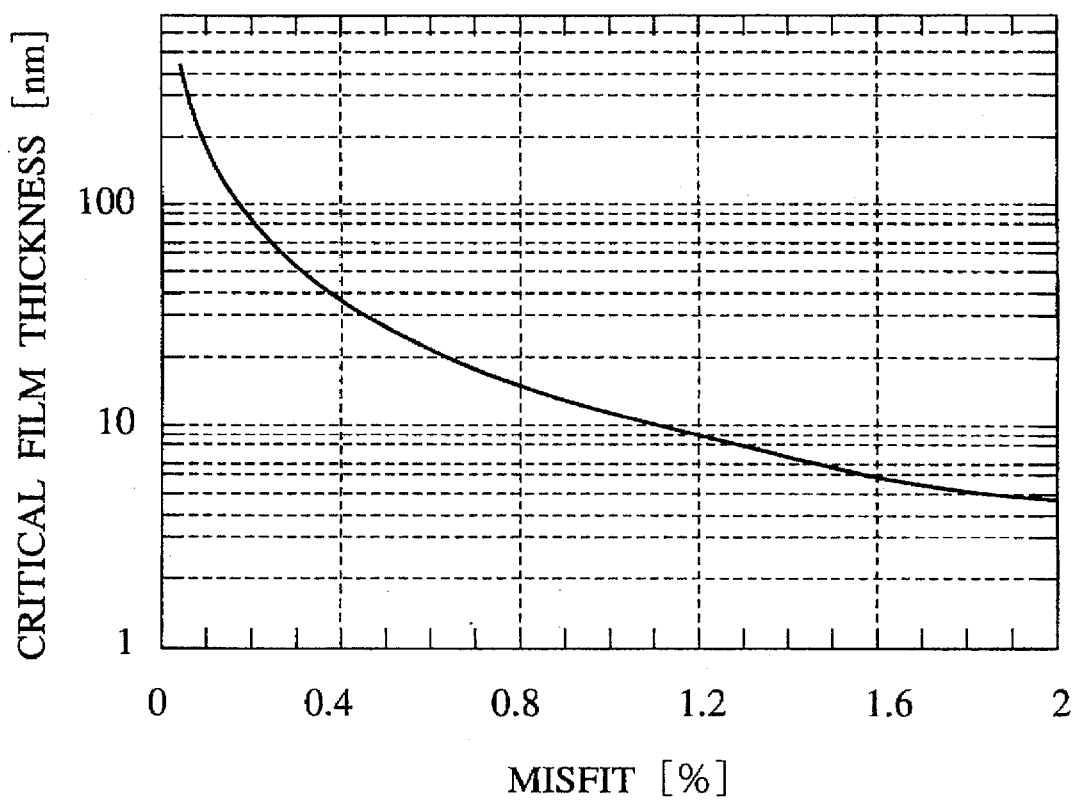
FIG. 1 is a graph of relationships between lattice misfit and critical film thickness for a NiAl film based on the Matthews et al. theory.

FIG. 1 shows the result of computation of relationships between the lattice misfit and the film thickness on the assumption that a Bergers vector for NiAl is <110> and a Poisson ratio for NiAl is 0.3. As shown in FIG. 1, NiAl has a critical film thickness 10 nm for a lattice misfit of 1%. In using NiAl as the wiring, occurrence of misfit dislocations is unavoidable.

Then the inventors found that a third atom is mixed in a binary intermetallic compound to obtain a ternary intermetallic compound, whereby lattice misfit between a compound semiconductor substrate and a intermetallic compound is mitigated to increase a critical film thickness.

Then, a method for the lattice matching by the use a ternary compound according to the present invention will be explained.

TABLE 1 shows intermetallic compounds twice of whose lattice constants are substantially equal to lattice compounds of compound semiconductors.

TABLE 1

| Intermetallic compound | Lattice constant [nm] | Lattice misfit with GaAs [%] | Lattice misfit with InP [%] | Lattice misfit with InAs [%] |
|---|---|---|---|---|
| CoAl | 0.2861 | 1.22 | −2.50 | −5.55 |
| CoGa | 0.2878 | 1.82 | −1.92 | −4.99 |
| NiAl | 0.2886 | 2.10 | −1.65 | −4.73 |
| NiGa | 0.2887 | 2.14 | −1.62 | −4.69 |

TABLE 1-continued

| Intermetallic compound | Lattice constant [nm] | Lattice misfit with GaAs [%] | Lattice misfit with InP [%] | Lattice misfit with InAs [%] |
|---|---|---|---|---|
| FeAl | 0.2909 | 2.91 | −0.87 | −3.97 |
| FeGa | 0.2910 | 2.95 | −0.83 | −3.94 |

As shown in FIG. 1, the lattice constants of these intermetallic compound are positive with respect to GaAs and negative with respect to InP and InAs.

It is known that these intermetallic compound increase the lattice constants by substituting Al or Ga, which are Group III metal elements, with In. Accordingly it is possible that In is added to these intermetallic compounds to prepare ternary compounds to thereby decrease the lattice misfits with respect to Inp or InAs substrates.

For example, the lattice constant of NiIn of δ phase, which is of cubic system, is 0.309 nm, is changed to a positive lattice misfit with respect to InP and InAs. Accordingly a compound is formed of a set ratio of NiAl or NiGa, and NiIn to form a intermetallic compound having lattice matching with respect to InP and InAs.

TABLE 2 shows composition ratios of the above-stated intermetallic compounds, and In added to the intermetallic compounds for lattice matching.

TABLE 2

| Intermetallic Compound | x (InP Substrate) | x (InAs Substrate) |
|---|---|---|
| $CoIn_xAl_{1-x}$ | 0.37 | 0.84 |
| $CoIn_xGa_{1-x}$ | 0.28 | 0.75 |
| $NiIn_xAl_{1-x}$ | 0.24 | 0.71 |
| $NiIn_xGa_{1-x}$ | 0.23 | 0.70 |
| $FeIn_xAl_{1-x}$ | 0.12 | 0.59 |
| $FeIn_xGa_{1-x}$ | 0.12 | 0.58 |

Next, the method for fabricating a semiconductor device according to a first embodiment of the present invention will be explained with reference to FIGS. 2 and 3.

Figure 2:
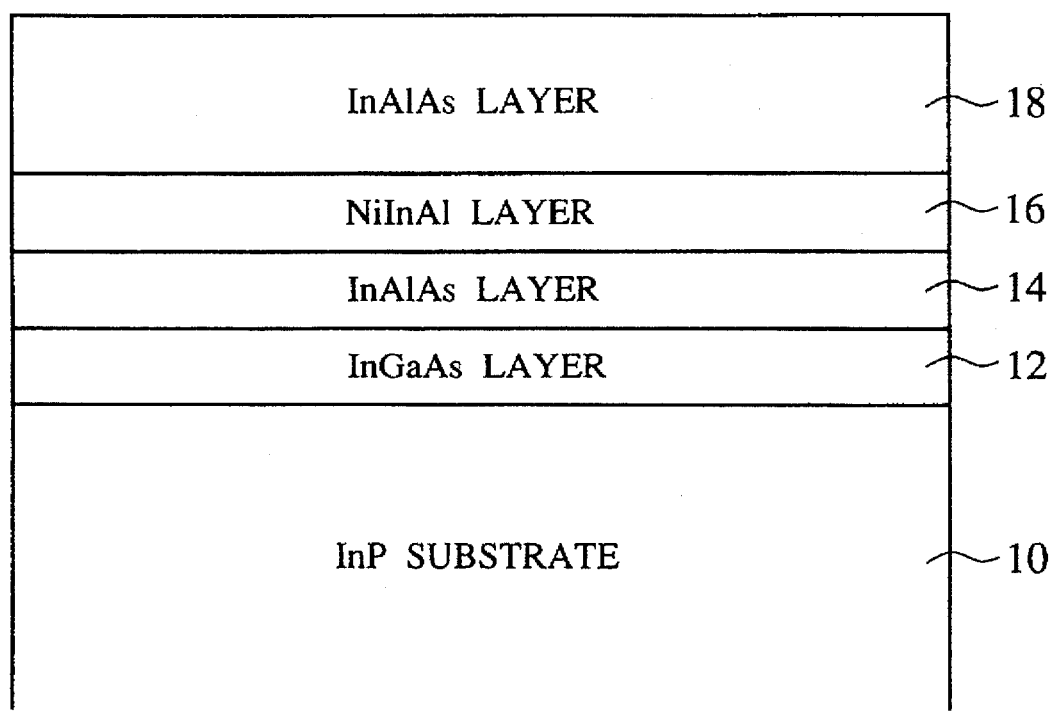
FIG. 2 is a view of the structure of the semiconductor device according to a first embodiment of the present invention.

FIG. 2 is a view of the structure of a semiconductor device fabricated by the method according to the present embodiment. FIG. 3 is a graph of the relationships between lattice misfit of a intermetallic compound formed by the present embodiment, and the critical film thickness.

In the present embodiment, a buffer layer formed of two layers of an InGaAs layer 12 and an InAlAs layer 14, a NiInAl layer 16 of the intermetallic compound, and an InAlAs layer 18 are continuously deposited on an InP substrate 10 by MBE. The raw materials, aluminium (Al), arsenic (As), gallium (Ga), indium (In) and nickel (Ni) were supplied by a Knudsen cell (k-cell).

First, the InP substrate 10 was degreased and treated with a liquid chemical, and was secured to a molybdenum (Mo) block and introduced into an ultra-high vacuum chamber. Then thermal cleaning was conducted in an about $3 \times 10^{-6}$ Torr As atmosphere. Then the buffer layer of the InGaAs layer 12 of a 100 nm thickness and the InAlAs layer 14 of an 100 nm thickness was deposited. For lattice matching between the buffer layer and the InP substrate 10, the InGaAs layer 12 had a composition of $In_{0.53}Ga_{0.47}As$, and the InAlAs layer had a composition of $In_{0.52}Al_{0.48}As$. The crystallization of the buffer layer was evaluated by reflection high energy electron diffraction method (RHEED). The stably exposed arsenic surface had a 2×4 pattern, and Kikuchi lines and zero-th order Laue rings were observed. The crystallization was found good.

A NiInAl layer 16 of a intermetallic compound was formed on the thus-formed InAlAs layer. At this time, for the prevention of influence of the As in the background, the shutter of the As cell is closed after the buffer layer has been formed, and after the As cell was cooled to the room temperature, a Ni cell was heated.

To fit a lattice constant of NiInAl with that of the buffer layer, as shown in FIG. 2, $NiIn0.24Al_{0.76}$ is deposited. With an Ni cell set at 1500° C., an In cell set at 520° C., and an Al cell set at 920° C., the deposition was conducted, and the NiInAl layer 16 of the above-described composition ratio was prepared.

The NiInAl layer 16 of the above-described composition was deposited at a 250° C. substrate temperature by alternately supplying In and Al, which are Group III metals, and Ni of another Group. At this time, the growth was paused for 2 seconds respectively when the source of Ni was switched to the sources of In and Al, and when the sources of In and Al were switched to the source of In.

The thus deposited NiInAl layer 16 of a 100 nm thickness was evaluated by RHEED. A sharp streak pattern coming from the NiInAl layer 16 of cubic system was observed. Streak patterns represent crystals having good crystallization and good surface flatness. Accordingly it was fond that the NiInAl layer 16 had two-dimensionally grown with good crystallization epitaxially on the InAlAs layer 14. The NiInAl layer 16 had a resistivity of about 20 µΩ.cm, which was substantially equal to the bulk material.

The NiInAl layer 16 was deposited in the same way at a substrate temperature of 350° C. The RHEED images had a spot pattern of cubic system. But a three-dimensional growth took place at the start of an about 2 nm growth. The NiInAl layer 16 could not have good quality. To two-dimensionally grow an intermetallic compound to be a good film it is preferred that a substrate temperature is below 300° C.

In the above-described embodiment, In and Al, which are Group III elements, and Ni, which is an element of another Group, were alternately supplied to grow respective layers of the three elements. The film had better quality than that grown by simultaneously supplying the three elements.

Then, the InAlAs layer 18 was deposited on the thus-formed NiInAl layer 16. An As cell was heated with a substrate temperature kept at 250° C. The InAlAs layer of 5 elements as a buffer layer was grown by migration enhanced epitaxy (MEE), and then the InAlAs layer 18 of an about 200 nm thickness was deposited at a 500° C. substrate temperature. During the growth, crystallization of the InAlAs layer was observed at the site by RHEED. The RHEED images always had a streak pattern. It was found that the film could not have a good quality.

Then, relationships between compositions of the NiInAl layer 16 and the critical film thickness will be explained.

In $NiIn_xAl_{1-x}$, x dependence of the critical film thickness was studied when x was changed from 0.24 to 0.30. Values of x correspond to lattice misfits changed from 0 to 0.4%.

Figure 3:
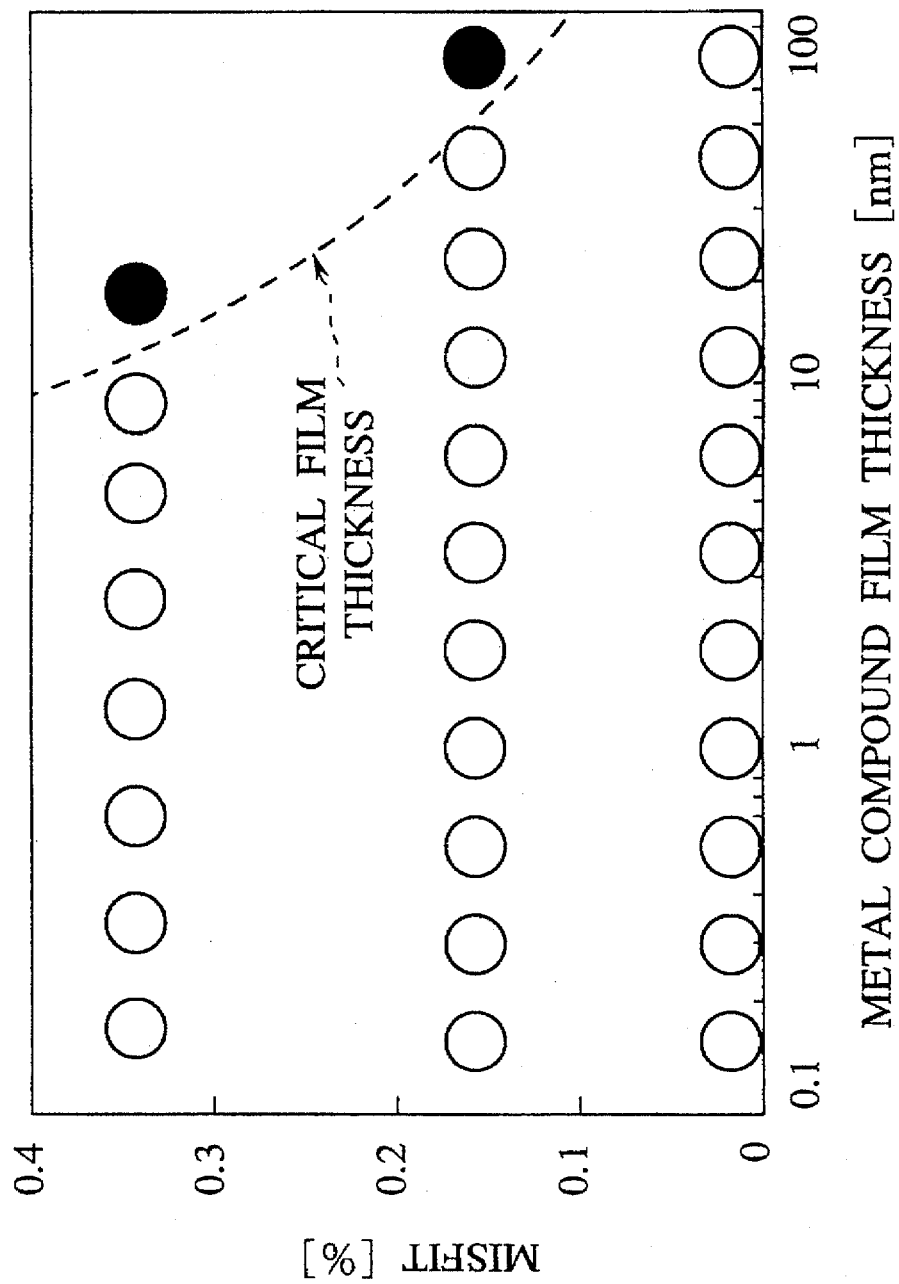
FIG. 3 is a graph of relationships between lattice misfits and critical film thicknesses of the intermetallic compound formed according to the first embodiment.

In FIG. 3, O indicates conditions for good quality films formed by two-dimensional growth, ● indicates conditions for polycrystal films formed by three-dimensional growth. As seen in FIG. 3, a critical film thickness which allows two-dimensional growth is smaller as a lattice misfit is higher. Accordingly a composition ratio is adjusted in accordance with a required film thickness. For example, when a 40 m film thickness is required, a lattice misfit is maintained at below about 0.2%. When a 100 nm film thickness is required, a lattice misfit is retained at below about 0.1%.

In substituting the lattice misfits by values of x, x is set within 0.24±0.04, and a layer free from misfit dislocations can be formed in above 40 nm, and x is set within 0.24±0.02, and a layer free from misfit dislocations can be formed in above 10 nm.

Thus, according to the present embodiment, a mixed crystal is formed of NiAl, which is an intermetallic compound, and In, which is a III Group metal, whereby lattice matching with the InP substrate, or $In_{0.53}Ga_{0.47}As$ or $In_{0.52}Al_{0.48}As$ was obtained. An intermetallic compound layer of NiAl can be epitaxially grown on a compound semiconductor.

By setting a lattice misfit at below 0.2%, an above 40 nm layer free from misfit dislocations can be formed. By setting a lattice misfit at below 0.1%, an above 100 nm layer free from misfit dislocations can be formed. The intermetallic compound layer can be used as a wiring layer of low resistivity.

Furthermore, a semiconductor layer can be epitaxially grown on the thus grown intermetallic compound layer. The intermetallic compound layer can be used a buried wiring layer. As a result, a wiring area can be saved, and the device can be accordingly size-downed.

Group III metals, and another metal are alternately supplied to epitaxially grow the intermetallic compound layer, so that the formed film can have higher quality than a film formed by simultaneously feeding the three elements, and an intermetallic compound of good crystallization can be two-dimensionally grown on a base substrate.

The present invention is not limited to the above-described embodiment and covers other modifications and variations.

In the above-described embodiment, a mixed crystal was formed of NiAl, which is an intermetallic compound, and In, which is a Group III metal, whereby an intermetallic compound which can have lattice matching with a compound semiconductor having a lattice constant equal to an InP substrate or InP was formed. But it is possible that other intermetallic compounds contain In. For example, intermetallic compounds which are able to epitaxially grow can be formed by using CoAl, CoGa, NiGa, FeAl, or FeGa. In this case, ternary intermetallic compounds containing In by the compositions stated in TABLE 2 are formed.

In a case that the compound semiconductor substrate is InAs substrate, ternary intermetallic compounds containing In by the compositions of TABLE 2 are formed, whereby intermetallic compound layers free from misfit dislocations can be epitaxially grown.

In a case that the above-described intermetallic compound layers are used as wiring layers, mixing amounts of In can be ±0.04 with respect to the compositions of TABLE2. To form thicker wiring layers, preferably In mixing amounts are ±0.02 with respect to the compositions of TABLE 2.

The semiconductor device and the method for fabricating the semiconductor device according to a second embodiment of the present invention will be explained with reference to FIGS. 4 to 8.

Figure 4:
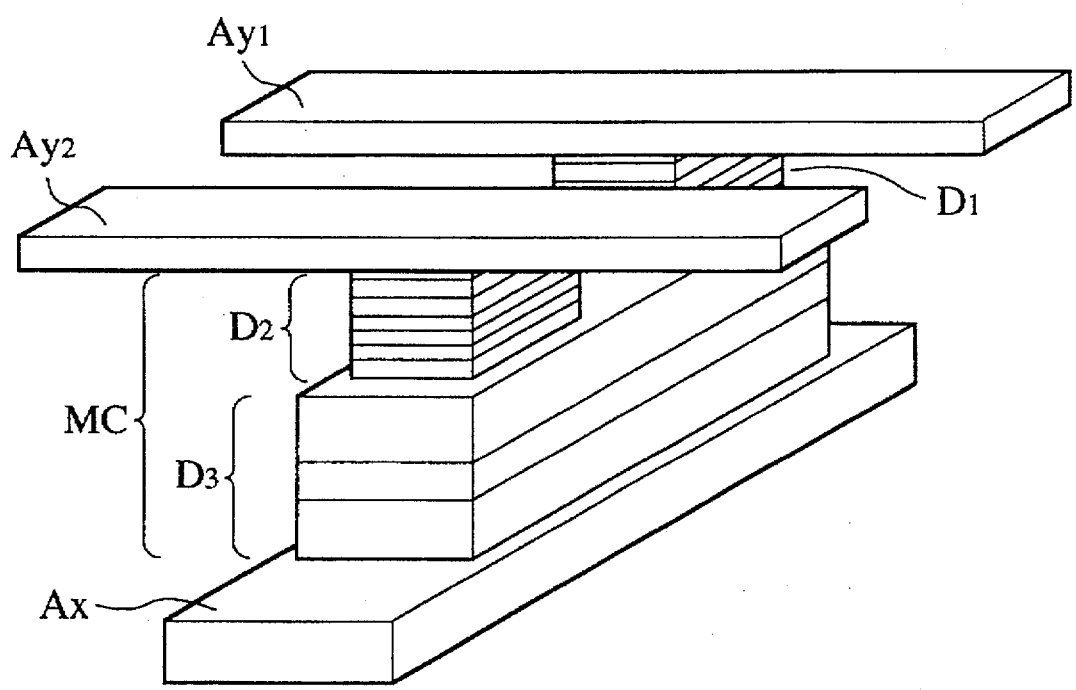
FIG. 4 is a view of the structure of a quantum effect memory device.
Figure 5A:
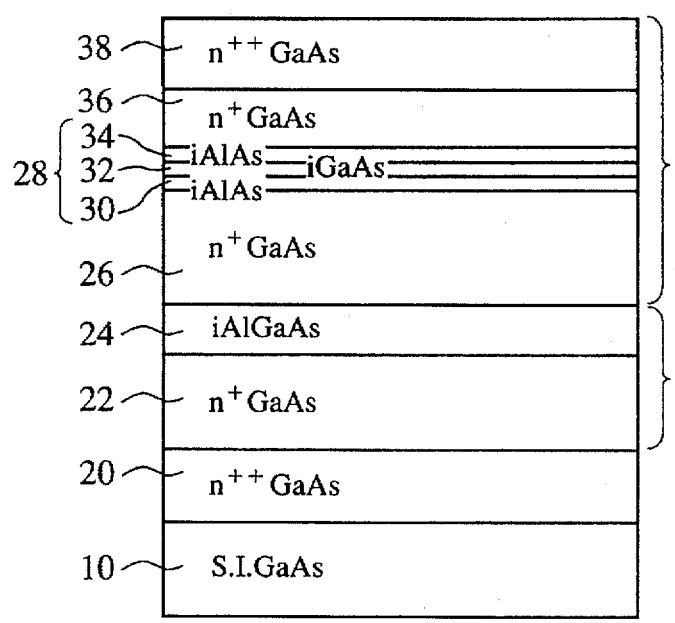
FIGS. 5A and 5B are views of the structure of a conventional quantum memory device.
Figure 5B:
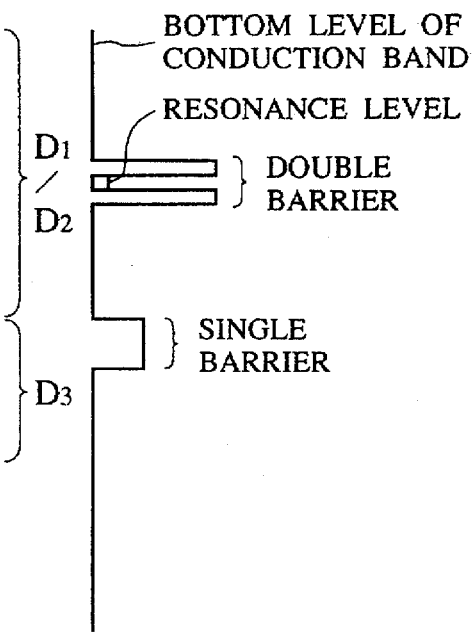
Figures 6A, 6B:
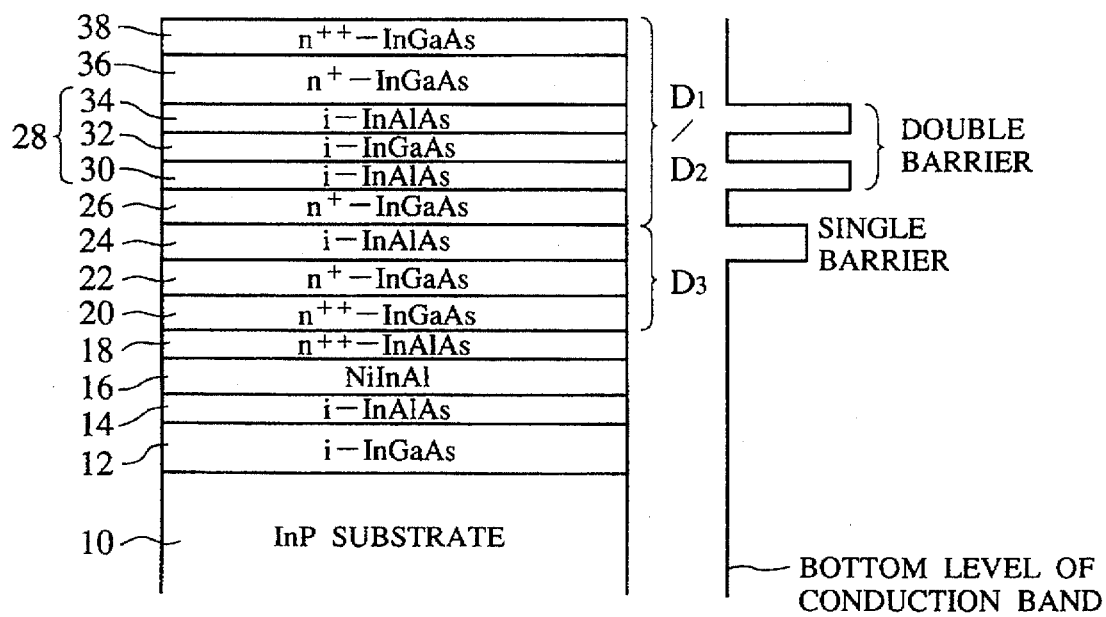
FIGS. 6A and 6B are views of the structure of a quantum effect memory device according to a second embodiment of the present invention.

FIG. 4 is a view showing the structure of a quantum effect memory device. FIG. 5 is a view of the structure of the conventional quantum effect memory device. FIG. 6 is a view of the structure of the quantum effect memory device according to the present embodiment. FIGS. 7 and 8 are views explaining the method for fabricating the semiconductor device according to the present embodiment.

The method for fabricating the semiconductor according to the present embodiment is used in applying the intermetallic compound involved in the first embodiment to a quantum effect memory device comprising transistors of double emitter structure having negative differential characteristics.

FIG. 4 is a view of the solid structure of the quantum effect memory device described in Japanese Patent Laid-Open Publication No. 112426/1994 filed by the applicant of the present application.

A row address signal wiring layer Ax crosses column address signal wiring layers Ay1, Ay2 comprising one pair of two parallel signal lines. A memory cell layer MC is formed at the intersections between the row address signal wiring layer Ax and the column address signal wiring layers Ay1, Ay2. The memory cell layer MC are formed in layers of a base/emitter first junction layer D1, a base/emitter second junction layer D2 and a base/collector junction layer with one side of the base/collector junction D3 electrically connected to the row address signal wiring layer Ax, the base/collector junction D3 having a characteristic of flowing current at a set threshold voltage Vth to the side of the row address signal wiring layer Ax, with the base/emitter junction D1 electrically connected with one Ay1 of the column address signal wiring layers Ay1, Ay2 between the other side of the base/collector junction D3 and said one Ay1 of the column address signal wiring layers Ay1, Ay2, and with the base/emitter junction D2 electrically connected with the other Ay2 of the column address signal wiring layers Ay1, Ay2 between the other side of the base/collector junction D3 and the other Ay2 of the column address signal wiring layers Ay1, Ay2.

FIG. 5 shows the sectional structure of the memory cell layer MC in FIG. 4.

As shown, on a semi-insulating or insulating substrate (GaAs substrate) 10 there are laid in the order stated below a good conductor layer ($n^{++}$-GaAs) 20, a conductor layer ($n^+$-GaAs) 22, a single barrier layer (i-AlGaAs) 24, a conductor layer ($n^+$-GaAs) 26, a resonant tunnel barrier layer (i-AlAs/i-GaAs/i-AlAs) 28, a conductor layer ($n^+$-GaAs) 36 and a good conductor layer ($n^{++}$-GaAs) 38. The resonant tunnel barrier layer 28 has a resonant tunnel structure in which a quantum well layer (i-GaAs) 32 is sandwiched by the tunnel barrier layers (i-AlAs) 30, 34.

The conductor layer ($n^+$-GaAs) 22 and the single barrier layer (i-AlGaAs) 24 constitute the base/collector junction layer D3. The resonant tunnel structure in which the resonant tunnel barrier layer (i-AlAs/i-GaAs/i-AlAs) 28 is sandwiched by the conductor layer ($n^+$-GaAs) 26, and the conductor layer ($n^+$-GaAs) 36 and the conductor layer ($n^{++}$-GaAs) 38 constitutes the base/emitter junction layers D1, D2.

The row address signal wiring layer Ax is formed of the conductor layer ($n^{++}$-GaAs) 20, and if the row address signal wiring layer Ax can have lower specific resistance, signal transmission delay due to the wiring layer resistance can be decreased. If the wiring layer is formed of a metal layer, improved heat radiation can be expected due to high thermal conductivity of metal. Here the present embodiment discusses a quantum effect memory device using an intermetallic compound as the row address signal wiring layer Ax.

FIG. 6 shows the structure of the quantum effect memory device according to the present embodiment.

As shown, on a semi-insulating InP substrate (S.I.InP) 10 there are laid in the order stated below a first buffer layer (i-InGaAs) 12, a second buffer layer (i-InAlAs) 14, an intermetallic compound wiring layer (NiInAl) 16, a seed layer ($n^{++}$-InAlAs) 18, a conductor layer ($n^{++}$-InGaAs) 20, a conductor layer ($n^+$-InGaAs) 22, a single barrier layer (i-InAlAs) 24, a conductor layer ($n^+$-InGaAs) 26, a resonant tunnel barrier layer 28 (i-InAlAs/i-InGaAs/i-InAlAs), a conductor layer ($n^+$-InGaAs) 36, and a conductor layer ($n^{++}$-InGaAs) 38. The resonant tunnel barrier layer 28 has a resonant tunnel structure in which a quantum well layer (i-InGaAs) 32 is sandwiched by tunnel barrier layers (i-InAlAs) 30, 34.

The conductor layer ($n^+$-InGaAs) 22 and the single barrier layer (i-InAlAs) 24 constitute a base/collector junction layer D3. The resonant tunnel structure in which the resonant tunnel barrier layer (i-InAlAs/i-InGaAs/i-AlAs) 28 is sandwiched by the conductor layer ($n^+$-InGaAs) 26, and the conductor layer ($n^+$-InGaAs) 36 and the conductor layer ($n^{++}$-GaAs) 38 constitutes the base/emitter junction layers D1, D2.

The intermetallic compound wiring layer 16, which is formed of a NiInAl layer, can be epitaxially grown on the base InAlAs layer. The quantum effect memory device can be fabricated on the intermetallic compound wiring layer 16.

Then, the method for fabricating the semiconductor device according to the present embodiment will be explained.

Figure 7A:
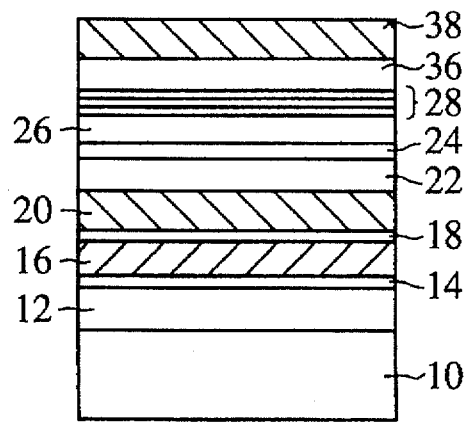
FIGS. 7A to 7C are views explaining the method for fabricating the semiconductor device according to the second embodiment of the present invention.
Figure 7A:
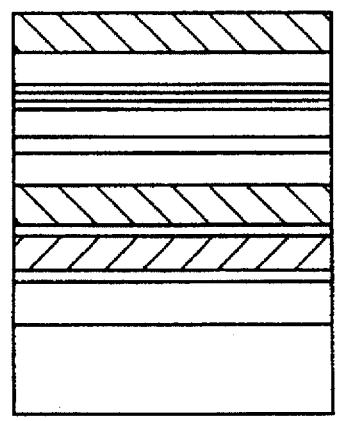

On the semi-insulating InP substrate (S.I.InP) 10 are formed sequentially in layers the first buffer layer (i-InGaAs) 12 of 200 nm thickness, the second buffer layer (i-InAlAs) 14 of 10 ; nm thickness, the intermetallic compound wiring layer (NiInAl) 16 of 100 nm thickness, the seed layer ($n^{++}$-InAlAs) 18 of 2 nm thickness, the conductor layer ($n^{++}$-InGaAs) 20 of 100 nm thickness, the conductor layer ($n^+$-InGaAs) 22 of 100 nm thickness, the single barrier layer (i-InAlAs) 24 of 60 nm thickness, a conductor layer ($n^+$-InGaAs) 26 of 100 nm thickness, the resonant tunnel barrier layer 28 of 12 nm thickness (i-InAlAs: 4 nm thickness/i-InGaAs: 4nm thickness/i-InAlAs: 4 nm thickness), the conductor layer ($n^+$-InGaAs) 36 of 300 nm thickness, and the conductor layer ($n^{++}$-InGaAs) 38 of 50 nm thickness (FIG. 7A).

Here as described above, the intermetallic compound wiring layer 16, which is formed of a NiInAl layer, can be epitaxially grown on the base InAlAs layer, and a semiconductor layer can be epitaxially grown on the intermetallic compound wiring layer 16.

The respective layers were deposited by MBE, and the intermetallic compound wiring layer 16 and the seed layer 18 are formed at a 200° C. substrate temperature, and the rest layers were formed at a 500° C. substrate temperature.

Figure 7B:
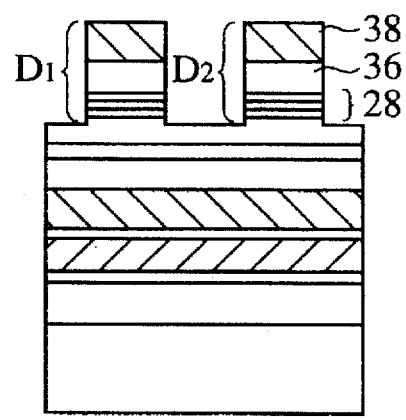
Figure 7B:
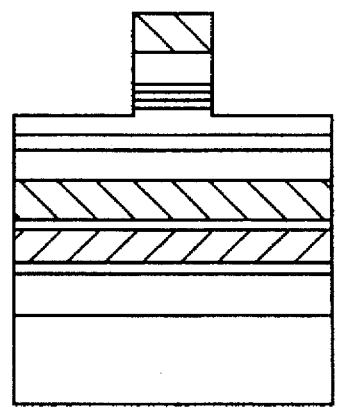

Then lithograph and wet etching was conducted to the resonant tunnel barrier layer 28 to form the base/emitter junction layers D1, D2 having the resonant tunnel structure (FIG. 7B).

Figure 7C:
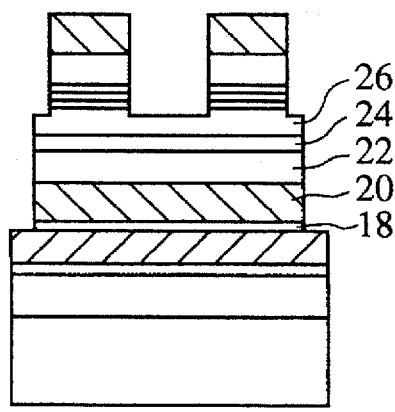
Figure 7C:
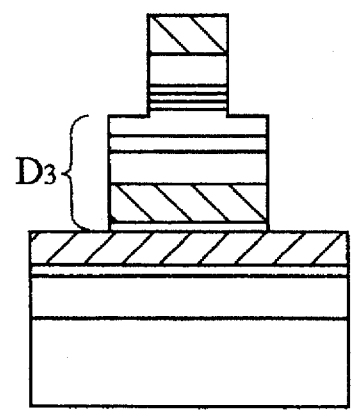

Then lithograph and wet etching are conducted to the seed layer 18 to form the base/collector junction layer D3 including the conductor 22 and the single barrier layer 24 (FIG. 7C).

Figure 8A:
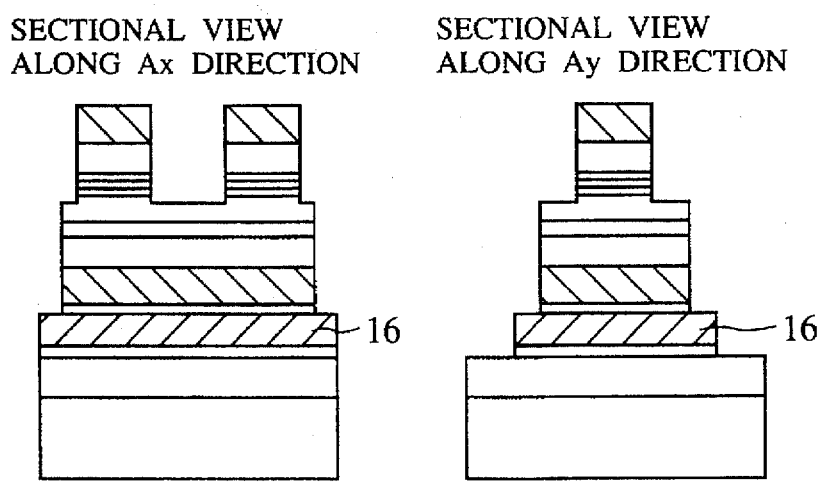
FIGS. 8A to 8C are views explaining the method for fabricating the semiconductor device according to the second embodiment of the present invention.
Figure 8B:
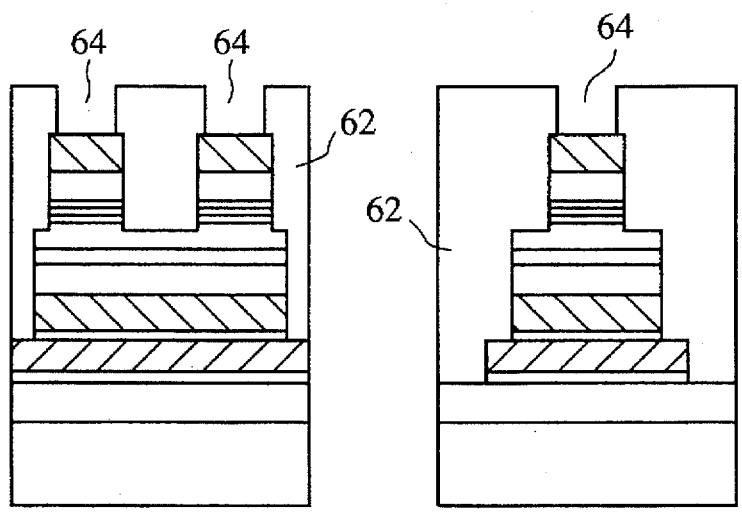

Furthermore, the intermetallic compound wiring layer 16 is formed into the row address signal wiring layer Ax by lithography and sputter etching (FIG. 8A).

Figure 8C:
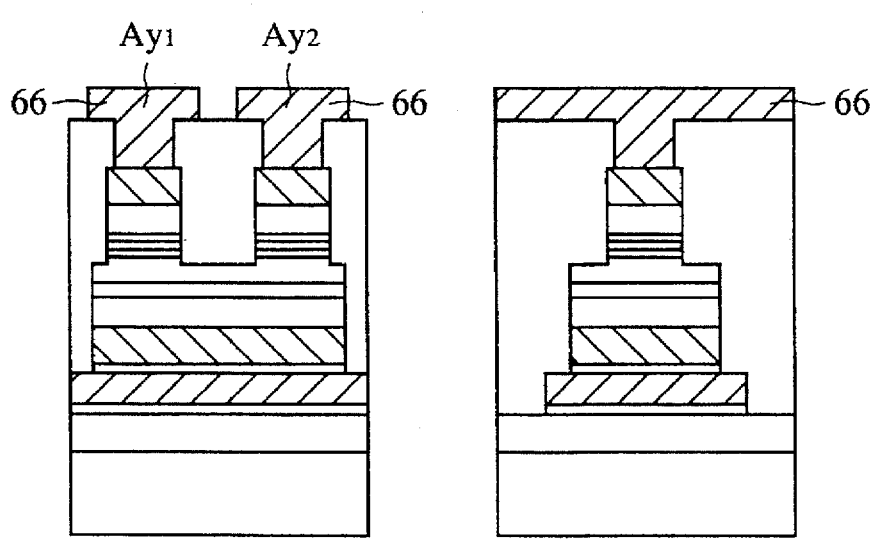
Figure 9A:
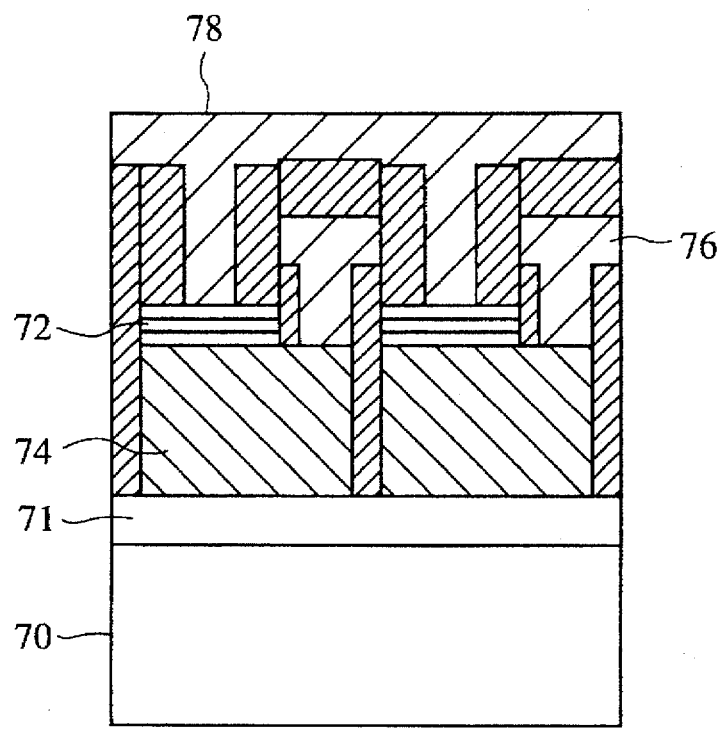
FIGS. 9A and 9B are views explaining the structure of a conventional semiconductor device.
Figure 9B:
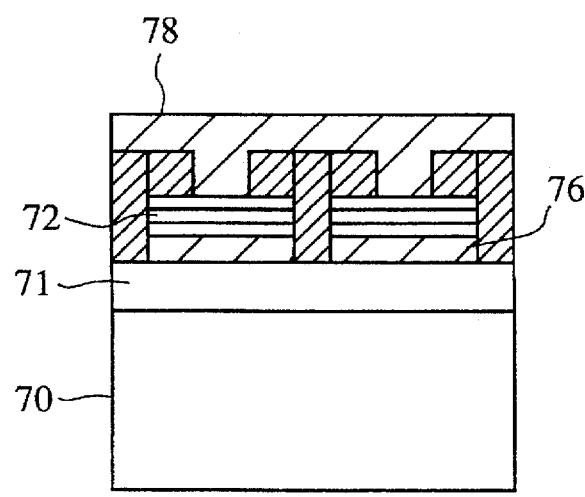

Next, an inter-layer insulation film 62 is deposited to form a contact hole 64 (FIG. 8B), and the column address signal wiring layers Ay1, Ay2 are formed in top wiring layer 66, and the semiconductor device according to the present embodiment is completed (FIG. 8C).

Thus, according to the present embodiment, the ternary intermetallic compound having lattice matching with a base substrate is used, whereby a semiconductor layer can be epitaxially grown on the intermetallic compound wiring layer. The buried wiring layer can be formed.

The row address signal wiring layer Ax is formed of the intermetallic compound. The semiconductor device can have little signal transmission delay due to resistance of the wiring layer. High thermal conductivity of the intermetallic compound can improve heat radiation of the semiconductor device.

The present invention is not limited to the above-described embodiment and covers other modifications and variations. In the above-described embodiment, the intermetallic compound having lattice misfit mitigated is applied to the quantum effect memory device including transistors of the double-emitter type having negative differential characteristics. But the intermetallic compound is usable as metal layers with good crystallization, and is applicable to other uses.

What is claimed is:

1. A semiconductor device comprising a base substrate and an intermetallic compound layer made of an intermetallic compound formed on the base substrate, the intermetallic compound being a ternary intermetallic compound mixing a set amount of In with one of CoGa, NiGa, FeGa, CoAl, NiAl and FeAl, twice of a lattice constant of the ternary intermetallic compound being substantially equal to a lattice constant of compound semiconductor forming the base substrate.

2. A semiconductor device according to claim 1, further comprising a compound semiconductor layer made of a compound semiconductor formed on the intermetallic compound layer, the compound semiconductor layer being epitaxially grown on the intermetallic compound layer.

3. A semiconductor device according to claim 1, wherein a film thickness of the intermetallic compound layer is above about 40 nm.

4. A semiconductor device according to claim 1, wherein a film thickness of the intermetallic compound layer is above about 100 nm.

5. A semiconductor device according to claim 1, wherein a lattice misfit between twice of the lattice constant of the intermetallic compound layer and the lattice constant of the compound semiconductor forming the base substrate is below about 0.2%.

6. A semiconductor device according to claim 1, wherein a lattice misfit between twice of the lattice constant of the intermetallic compound layer and the lattice constant of the compound semiconductor forming the base substrate is below about 0.1%.

7. A semiconductor device according to claim 1, wherein the base substrate is an InP substrate.

8. A semiconductor device according to claim 1, wherein the base substrate is an $In_{0.53}Ga_{0.47}As$ layer or an $In_{0.52}Al_{0.48}As$ layer.

9. A semiconductor device according to claim 7, wherein the intermetallic compound is $CoIn_xAl_{1-x}$, and x is within a range of $0.37\pm0.04$.

10. A semiconductor device according to claim 7, wherein the intermetallic compound is $CoIn_xGa_{1-x}$, and x is within a range of $0.28\pm0.04$.

11. A semiconductor device according to claim 7, wherein the intermetallic compound is $NiIn_xAl_{1-x}$, and x is within a range of $0.24\pm0.04$.

12. A semiconductor device according to claim 7, wherein the intermetallic compound is $NiIn_xGa_{1-x}$, and x is $0.23\pm0.04$.

13. A semiconductor device according to claim 7, wherein the intermetallic compound is $FeIn_xAl_{1-x}$, and x is $0.12\pm0.04$.

14. A semiconductor device according to claim 7, wherein the intermetallic compound is $FeIn_xGa_{1-x}$, and x is within a range of $0.12\pm0.04$.

15. A semiconductor device according to claim 8, wherein the intermetallic compound is $CoIn_xAl_{1-x}$, and x is within a range of $0.37\pm0.04$.

16. A semiconductor device according to claim 8, wherein the intermetallic compound is $CoIn_xGa_{1-x}$, and x is within a range of $0.28\pm0.04$.

17. A semiconductor device according to claim 8, wherein the intermetallic compound is $NiIn_xAl_{1-x}$, and x is within a range of $0.24\pm0.04$.

18. A semiconductor device according to claim 8, wherein the intermetallic compound is $NiIn_xGa_{1-x}$, and x is $0.23\pm0.04$.

19. A semiconductor device according to claim 8, wherein the intermetallic compound is $FeIn_xAl_{1-x}$, and x is $0.12\pm0.04$.

20. A semiconductor device according to claim 8, wherein the intermetallic compound is $FeIn_xGa_{1-x}$, and x is within a range of $0.12\pm0.04$.

21. A semiconductor device according to claims 1, wherein the base substrate is an InAs substrate.

22. A semiconductor device according to claim 21, wherein the intermetallic compound is $CoIn_xAl_{1-x}$, and x is within a range of $0.84\pm0.04$.

23. A semiconductor device according to claim 22, wherein the intermetallic compound is $CoIn_xGa_{1-x}$, and x is within a range of $0.75\pm0.04$.

24. A semiconductor device according to claim 22, wherein the intermetallic compound is $NiIn_xAl_{1-x}$, and x is within a range of $0.71\pm0.04$.

25. A semiconductor device according to claim 22, wherein the intermetallic compound is $NiIn_xGa_{1-x}$, and x is within a range of $0.70\pm0.04$.

26. A semiconductor device according to claim 22, wherein the intermetallic compound is $FeIn_xAl_{1-x}$, and x is within a range of $0.59\pm0.04$.

27. A semiconductor device according to claim 22, wherein the intermetallic compound is $FeIn_xGa_{1-x}$, and x is within a range of $0.58\pm0.04$.

* * * * *